United States Patent [19]

Richter

[11] 4,149,120

[45] Apr. 10, 1979

[54] CIRCUIT ARRANGEMENT FOR LINEARIZING THE OUTPUT SIGNAL OF A TEST SENSOR

[75] Inventor: Claus Richter, Maulburg, Fed. Rep. of Germany

[73] Assignee: Endress & Hauser GmbH & Co., Maulburg, Fed. Rep. of Germany

[21] Appl. No.: 785,156

[22] Filed: Apr. 6, 1977

[51] Int. Cl.² ............................................. G01R 15/10
[52] U.S. Cl. ................................... 324/132; 307/229; 328/143; 364/573
[58] Field of Search .................. 324/132; 307/229; 328/143, 144, 145; 235/197; 364/573, 718, 852

[56] References Cited

U.S. PATENT DOCUMENTS

| | | | |
|---|---|---|---|
| 3,201,575 | 8/1965 | Werner et al. ........................ | 364/573 |
| 3,555,436 | 1/1971 | Elliott ................................. | 328/144 |
| 3,828,255 | 8/1974 | Schoun ................................ | 324/132 |

*Primary Examiner*—Palmer C. Demeo
*Assistant Examiner*—Ernest F. Karlsen
*Attorney, Agent, or Firm*—Polock, Vande Sande & Priddy

[57] ABSTRACT

A circuit arrangement for linearizing the output signal of a measuring sensor by comparing this output signal with a periodically repetitive signal which represents the measurement characteristic to be linearized. Upon equality of the compared signals, the instantaneous value of a periodically repetitive second signal, which is a linear function of time, is transmitted to form the linearized measurement signals. According to a preferred embodiment, the periodically repetitive signals are produced by digital devices.

8 Claims, 5 Drawing Figures

CIRCUIT ARRANGEMENT FOR LINEARIZING THE OUTPUT SIGNAL OF A TEST SENSOR

This invention relates to a circuit arrangement for linearising the output signal of a test sensor.

Test sensors, that provide an electrical signal (voltage or current) representative of the magnitude of a physical quantity to be measured, are often non-linear, that is, the electrical output signal is not proportional to the magnitude to be measured. If a graph is plotted of the output voltage as a function of the measured value, a curve is obtained instead of a straight line. In many applications, it is however desirable or even necessary to obtain an output signal that is directly proportional to the measured value. A known solution of this problem consisting in the use of amplifiers with non-linear amplification characteristics, which compensate the non-linearity of the test sensor. Since, however, it is difficult to synthesize complicated curves exactly, it is usual to employ approximations, in which the desired amplification characteristic is replaced by a broken line formed of straight sections; the accuracy of this solution is restricted because of the limit placed for economic reasons on the number of curve sections. Amplifiers with logarithmic characteristics are also known, though these are restricted to the linearisation of the output signals of measuring sensors of which the output signals are exponential functions of the measured value. A further problem in the use of such non-linear amplifiers is the production of satisfactory temperature stability, which in general can be attained only at high cost. The linearisation of characteristics of more complex form, with inflexions, is very difficult with such arrangements.

There is also already known from published German patent application OS 24 21 926 a circuit arrangement for analog-digital conversion of the output signal of a measuring sensor, in which the measured voltage is compared with a comparison voltage which is obtained either from a resistancecapacitor combination of from a resistor-inductor combination. This known circuit arrangement is likewise restricted to the linearisation of the output signals of measuring sensors of which the electrical impedance is an exponential function of the value to be measured.

The object of the invention is to provide an arrangement for linearising the output signal of a measuring sensor which can linearise with arbitrarily high accuracy forms of characteristic having extreme differences in slope and containing inflexions, and can readily be adapted to any type of measuring sensor.

To solve this problem the circuit arrangement in accordance with the invention contains a first signal generator that generates a voltage waveform varying linearly as a signal of time, a second signal generator that generates synchronously with the first signal generator a periodically repetitive voltage waveform which imitates the measured value characteristic to be compensated, as a function of time, and a comparator which receives on the one hand the measuring sensor signal and on the other hand the output signal of the second signal generator and which, in response to equality of the two signals, initiates the transmission of the instantaneous value of the output signal of the first signal generator as the measured value signal.

In each period of its operation the circuit arrangement according to the invention provides a measured value signal that is directly proportional to the actual value of the measured magnitude, regardless of the non-linearity of the output signal of the measuring sensor. The essential condition for this is that the voltage waveform periodically generated by the second signal generator accurately represents the measured value characteristic to be linearised as a function of time; linearisation is then always produced, even when the measurement characteristic is of very complex form, including inflexions, for example.

It is a particular advantage of the invention that the two signal generators may be constructed as digital devices. This makes possible on the one hand the imitation of complex functions by simple means and on the other hand yields all the advantages of digital techniques, especially the possibility of using proven, cheap and reliable integrated circuits and the insensitivity to external influences, such as changes in temperature or variations in supply voltage.

In a preferred embodiment of the invention, therefore, the first signal generator contains a pulse counter that receives the output inpulses of a pulse frequency divider connected to a clock generator and having a fixed dividing factor, and the second signal generator contains a pulse counter that receives the output impulses of a pulse frequency divider connected to the clock generator and having a variable dividing factor, together with a control arrangement for varying the dividing factor of the impulse frequency divider in accordance with the measuring sensor characteristic to be imitated.

In this embodiment of the invention the periodically repetitive voltage waveforms are approximated by staircase waveforms, so that the approximation becomes more accurate as the impulse repetition frequency increases. By a simple alteration of the dividing factor of the impulse frequency divider of the second signal generator, it is then possible of imitating any arbitrarily complex characteristic.

In an advantageous modification of this embodiment the control arrangement contains a programmable read-only memory, in which are stored the division factors to be set in succession in the course of each operating period.

In this modification the non-linear measurement sensor characteristic to be imitated is determined by the content of the programmable read-only memory. By appropriate programming of the read-only memory it is possible to adapt the circuit arrangement to any arbitrary measurement characteristic and also to take into account spreads between similar measuring sensors. In addition, the circuit arrangement can be adapted to a different measuring sensor at any time by simple replacement of the read-only memory.

Further features and advantages of the invention will be understood from the following description of an embodiment, given with reference to the drawings, in which.

Figure 1:
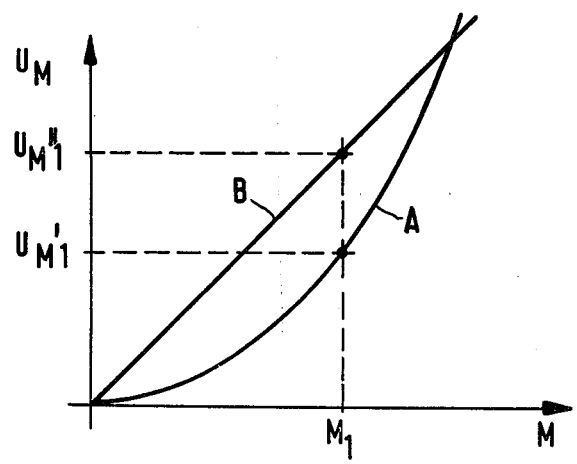
FIG. 1 is a diagram used to explain the problem underlying the invention.

In the diagram shown in FIG. 1, the characteristic A show the relation between the output voltage $U_M$ of a measuring sensor and the measured magnitude M; the measuring sensor may for example be an aluminium oxide humidity sensor. The characteristic A is curved, which shows that the output voltage $U_M$ is not directly proportional to the measured value M, but has a nonlinear relation to it. In a linear measuring sensor the output voltage would follow the characteristic B. If the measured value has a measured value $M_1$ at a particular instant, the measuring sensor corresponding to characteristic A provides an output voltage $U'_{M1}$, while the linearised output voltage must have the value $U''_{M1}$.

Figure 2:
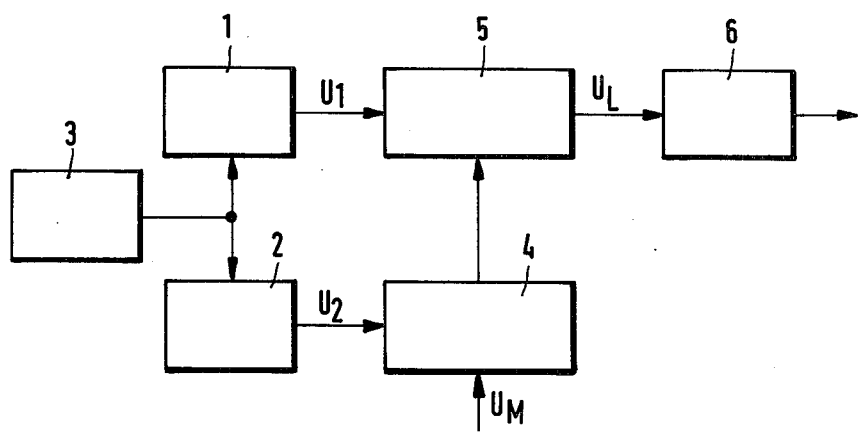
FIG. 2 is a basic circuit diagram of a circuit arrangement in accordance with the invention.
Figure 3:
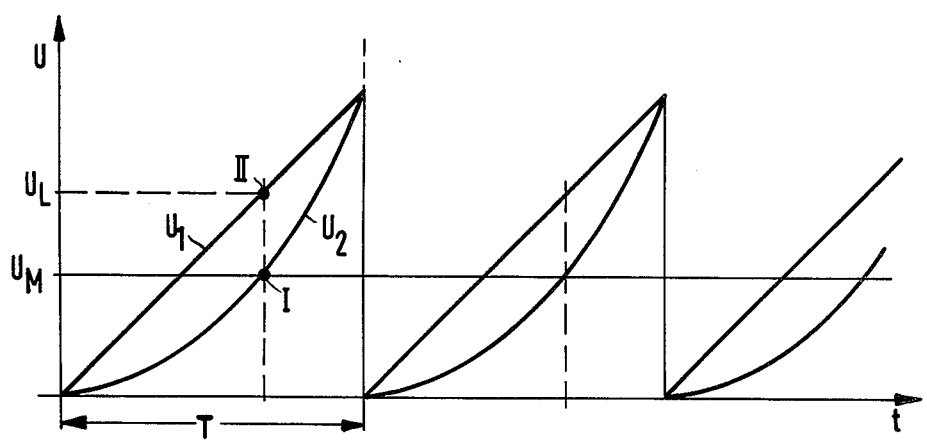
FIG. 3 is a diagram used to explain the mode of operation of the circuit arrangement of FIG. 2.

FIG. 2 shows the basic circuit diagram of a circuit arrangement for linearising a measuring sensor characteristic of the kind represented in FIG. 1; the mode of operation of this circuit arrangement can be understood from the diagram given in FIG. 3. The circuit arrangement of FIG. 2 contains a first signal generator 1, that generates a voltage $U_1$ rising linearly as a function of time t, which is represented in FIG. 3; this generator therefore develops a sawtooth waveform of period T. A second signal generator 2, which is synchronized with the first signal generator 1 by a synchronizing arrangement 3, generates a voltage $U_2$ with the same repetition period T. The voltage signal $U_2$ has a characteristic form as a function of time t that is the same as the form of the voltage response characteristic A of the sensor as a function of the measured value M or sensor input quantity.

That is, a plot of the generated signal voltage $U_2$ over a period T should match as closely as possible the shape of a corresponding plot of the output voltage UM of the sensor in response to applied measured values in the range of zero to M, where the measured value M of the sensor plot corresponds to the period T of the $U_2$ plot.

The comparator 4 of FIG. 2 operates in a manner known to the art to compare two input voltages and to generate an output gating signal when the voltages are equal. In accordance with the invention, the non-linear voltage signal $U_2$ that approximates the response characteristic of the sensor is applied to one input of the comparator and a particular instantaneous output voltage UM of the sensor is applied at the other comparator input. Of course, the instantaneous voltage UM is generated by the sensor in response to a corresponding instantaneous value of the measured quantity M.

The signal UM is assumed to maintain a constant value during one period T of the periodic signal $U_2$ so that, in effect, the instantaneous value of the UM signal is compared to all of the possible values of $U_2$ within the period T of the $U_2$ signal.

When a match is detected between the particular instantaneous UM value and a value of the "scanning" $U_2$ signal, the point in time at which the match is detected defines a time duration I within the period T that is directly proportional to the magnitude of the instantaneous value of the measured quantity M.

The gating signal that is generated by the comparator at the time I is then applied to a transfer control to sample the periodic ramp signal $U_1$, to obtain the magnitude of the signal $U_1$ at the time I. Since the ramp signal $U_1$ varies linearly over the period T, and since the time I is directly proportional to the measured value M, the sampled value of $U_2$ at the time I will likewise be directly proportional to M and, therefore, the value M and the value of $U_2$ at I will be linearly related.

More particularly, FIG. 3 illustrates the relation between the U1, U2 and UM signals. As explained previously, at the point of intersection I of the plog of U2 with the sensor output voltage UM, the comparator 4 generates an output signal that samples the instantaneous value of the signal U1 and thereby effectively translates the nonlinear value of UM to the linear value of UL. Of course, the value of UL corresponds to the point of intersection II of the plot of U1 and the vertical line corresponding to the time I.

The operation is repeated in each period, so that there appears at the output of the transmission control circuit 5 a sequence of voltage values which have the desired linear relation with the measured value. These voltage values can be stored from period to period in a store 6, connected following the transmission control circuit or is combined with this transmission control circuit. At the output of the store there is then continuously available a voltage which is equivalent to the output voltage of a linear measuring sensor.

Figure 4:
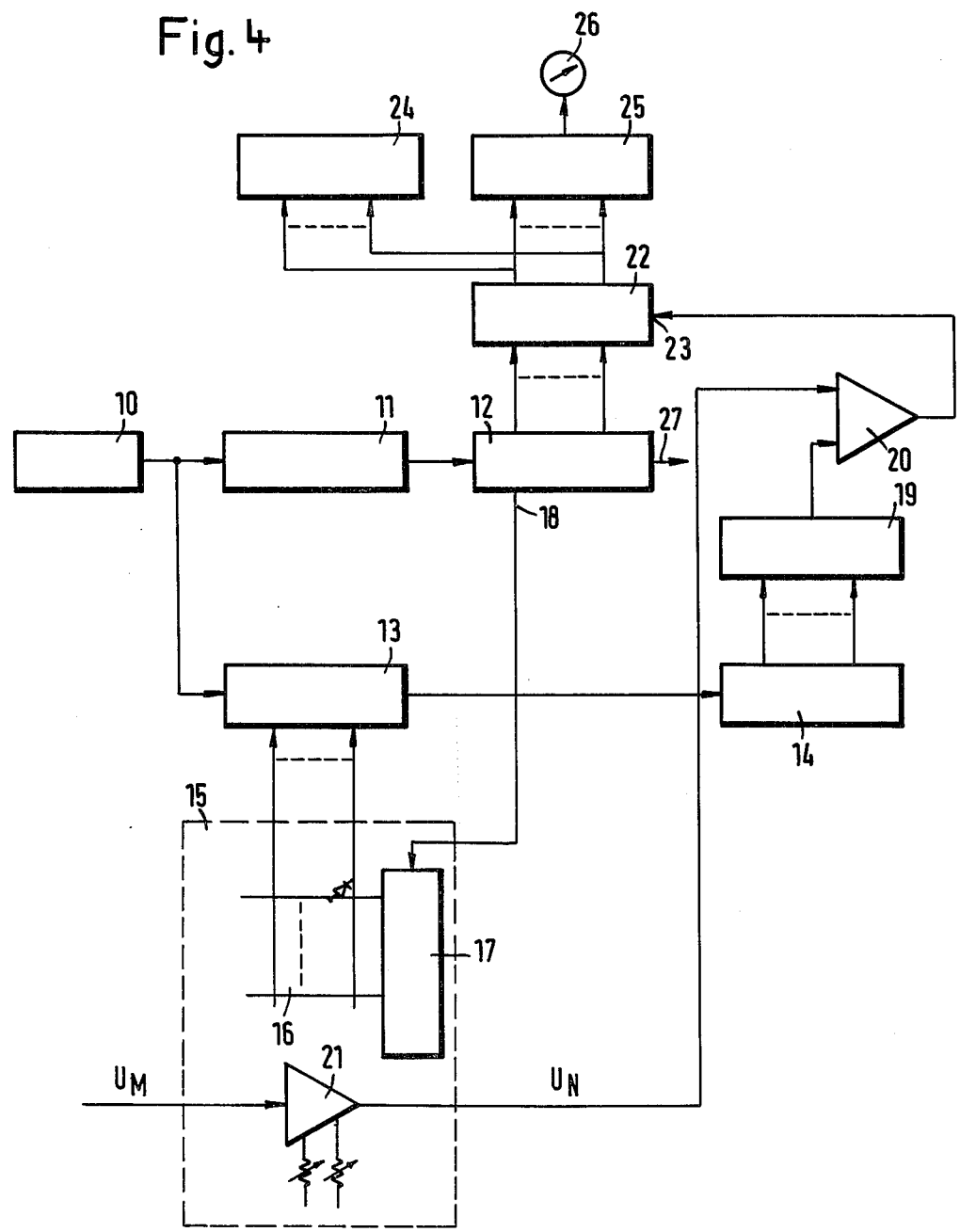
FIG. 4 is a circuit diagram of a digital embodiment of the circuit arrangement according to the invention.

FIG. 4 shows a digital circuit arrangement which yields the mode of operation explained with reference to FIGS. 2 and 3. The mode of operation of this circuit arrangement is represented for one measuring period in the diagram of FIG. 5.

The circuit arrangement of FIG. 4 contains a clock generator 10 that generates clock pulses having a fixed repetition rate, and of which the period is very short compared with the duration of the period of measurement T. The output of the clock generator 10 is connected with the input of a frequency divider 11 having a fixed dividing factor. To the output of the frequency divider 11 there is connected a pulse counter 12. The circuit units 11 and 12 together form the first signal generator: the content of the pulse counter 12 rises linearly with time from zero count to a maximum value determined by the capacity of this pulse counter and then returns abruptly to zero value. Thus the state of count of the pulse counter 12 approximates the linear sawtooth function in the form of a staircase waveform F of FIG. 5; the approximation is closer the greater is the number of impulses provided by the frequency divider 11 in one period T. The repetition rate of the output impulses of the frequency divider 11, in conjunction with the maximum count of the pulse counter 12 thus determine the resolution of the range to be linearised.

To the output of the clock generator 10 there is connected a second frequency divider 13, of which the dividing factor is adjustable by binary signals that are applied to control inputs. The impulses provided by the frequency divider 13 are counted in a second pulse counter 14. The alteration of the dividing factor of the frequency divider 13 is effected by a program unit 15. The circuit elements 13, 14 and 15 form the second signal generator: by alteration of the dividing factor of the frequency divider 13 it is arranged that the content of the pulse counter 14 alters more rapidly or more slowly than the the content of the pulse counter 12, so that the staircase curve representing the state of count of the pulse counter 14 has the desired curved form, as is represented by the curve G in FIG. 5.

The program unit 15 contains a programmable read-only memory (PROM) 16, in which the dividing factors to be set in succession in frequency divider 13 are stored in the form of binary numbers, and a program counter 17 which selects the storage locations in the PROM 16 in accordance with its state of count. The outputs of the PROM 16 are connected with the control inputs of the adjustable frequency divider 13, so that when a storage location in the PROM is selected the binary number stored therein determines the dividing factor of the frequency divider 13. The stepping of the program counter 17 is effected by an intermediate output of the pulse counter 12; a pulse is developed at this intermediate output each time that the pulse counter 12 has counted a predetermined fixed number of pulses applied to it from frequency divider 11.

Figure 5:
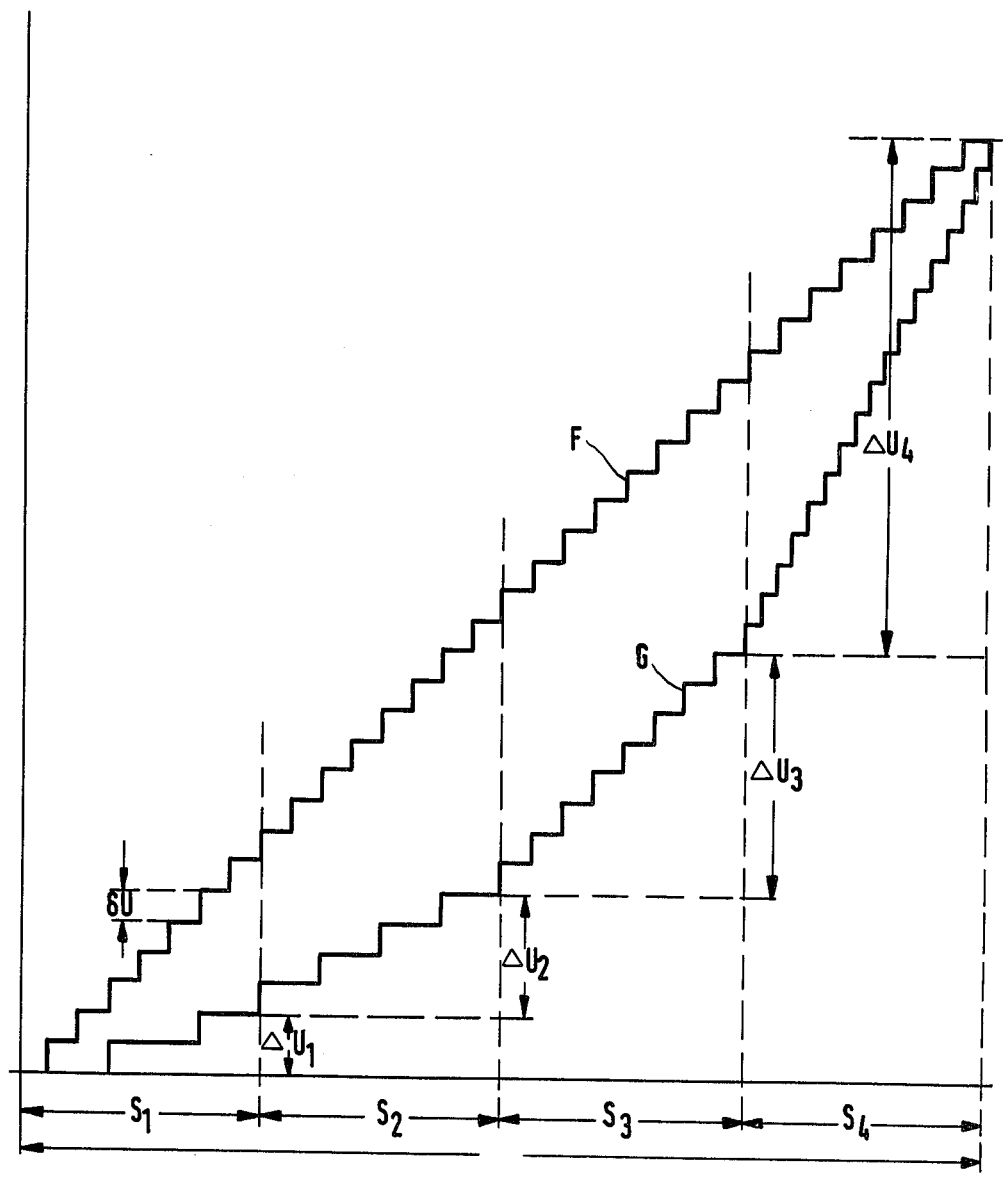
FIG. 5 is a diagram used to explain the mode of operation of the circuit arrangement of FIG. 4.

This modification yields the effect that the period T is divided into a number of equal segments, which each correspond to the same constant number of output impulses from the frequency divider 11. In FIG. 5 it is assumed as an example that the period T is divided into four segments $S_1$, $S_2$, $S_3$, $S_4$; according to the accuracy of the desired approximation it is however naturally possible to choose the number of segments in each period as large as required. Within each segment the dividing factor of the frequency divider 13 is constant; from one segment to the next it alters as necessary. This signifies that the characteristic imitated by the second signal generator 13, 14 is approximated by a sequence of rectilinear sections, of which the number corresponds to the number of segments. The PROM 16 contains a storage location for each segment, in which the dividing factor appropriate to that segment is stored, and the program counter 17 has a capacity corresponding to the greatest possible number of segments.

To the outputs of the individual stages of the pulse counter 14 there is connected a digital/analog converter 19, which yields an analog signal expressing the instantaneous state of count of the counter 14. The output of the digital/analog converter is connected with one input of a comparator 20.

The other input of the comparator 20 receives the output voltage $U_M$ of the measuring sensor, after this has been normalised in a normalising circuit 21 contained in the program unit 15, so that the normalised voltage $U_N$ applied to the input of the comparator always lies within the range between zero and a constant, adjustable maximum value.

To the individual stage outputs of the pulse counter 12 there is connected a transfer store 22, that has a transfer control input 23. The output of the comparator 20 is connected with the transfer control input 23.

When the comparator 20 determines equality between the output signal of the digital/analog converter 19 and the normalised measurement voltage $U_N$ it yields an output signal that is applied to the transfer control input 23 of transfer store 22 and causes the state of count of the counter 12 existing at this instant to be transferred into the store 22. Thus the linearised measured value is stored in store 22 until the next measurement period and is available at the output of the store.

The content of the store 22 may be employed in any arbitrary manner. By way of example, the outputs of the store 22 may as shown be applied to a digital display device 24 and on the other hand by way of a digital-/analog converter 25 to an analog display device 26. These display devices thus continuously display a measured value that has a linear relation to the measured value.

The function to be linearised is thus imitated by the contents of the PROM 16, which may be constructed for example in the form a a diode matrix or alternatively as an integrated circuit. The dividing factors to be stored in this PROM may easily be determined in the following simple manner:

It is initially assumed that the counter capacity $Z_{14}$ of the counter 14 corresponds to the maximum value $U_{Nmax}$ of the normalised measurement voltage. Each impulse counted in counter 14 thus corresponds to a voltage step $\delta U = U_{Nmax}/Z_{14}$. The same voltage scale also applies for the counter 12. The voltage changes $\Delta U_1$, $\Delta U_2$... in each of the segments $S_1$, $S_2$... for the function to be imitated are determined (FIG. 5). From this the number of impulses $n_1$, $n_2$... which must be applied to the counter 14 in each segment is found from the following equation:

$$n_i = (Z_{14}/U_{Nmax}) \cdot U_i$$

where i is any integer.

If the constant number of impulses that is applied to the counter 12 from frequency divider 11 in each segment $S_1$, $S_2$... is designated by $n_c$ and if the dividing factor of the frequency divider 11 is designated by $TF_{11}$, then the dividing factor set in the frequency divider 13 in each segment is given by the following formula:

$$TF_{13} = (n_c/n_i) \cdot TF_{11}.$$

The duration of the measurement period T is obtained from the frequency F of the clock generator 10 in accordance with the following equation;

$$T = (Z_{12} \cdot TF_{11})/F.$$

The end of the measurement period is indicated by the counter 12 returning to zero. A signal provided at the output 27 of the last stage of this counter when this occurs may be employed to return to their initial conditions all those circuit components for which this is necessary, for example the program counter 17 and also the pulse counter 14, since this has not necessarily reached its final counting state at the end of the measurement cycle. It is even advantageous to construct the pulse counter 14 with a capacity larger than that of the counter 12, so that greater adaptability and versatility as regards the characteristics to be imitated is obtained.

For this sake of clarity, the number of segments and the number of impulses per segment are chosen very small in FIG. 5; in actuality very much larger numbers of segments and of impulses will be employed, so that even complex functions can be imitated with good resolution. Characteristics with inflexions are obtained if the dividing factor of the frequency divider 13 first increases and then diminishes during a period.

The described circuit arrangement can be adapted to any desired kind of measuring sensor by simple replacement of the programmable read-only memory. It is also possible to employ the circuit in conjunction with several measuring sensors, it being only necessary to provide a program unit 15 for each measuring sensor, while the remaining circuit components are common to all of the measuring sensors. The program units control the same frequency divider 13 in parallel, and the measuring sensor selected at any time actiaves the associated program unit by a digital signal.

Another possible modification of the circuit arrangement of FIG. 4 consists in that the comparator 20 is a digital comparator and has one input (which is then appropriately arranged to accept multi-digit signals) connected directly to the stage outputs of the counter 14, so that the digital/analog converter 19 is omitted;

for this mode of operation an analog/digital converter is introduced between the output of the normalising circuit 21 and the other input of the comparator 20.

I claim:

1. A circuit for linearizing the output signal of a measuring sensor, comprising:

clock means for generating electrical clock pulses at a fixed pulse frequency;

first frequency divider means for receiving said clock pulses and generating corresponding first divider output pulses at a fixed frequency defined by a characteristic fixed dividing factor of said first divider;

first pulse counter means for counting the pulses generated by said first frequency divider and generating a first counter output signal corresponding to the instantaneous number of pulses counted;

second frequency divider means for receiving said clock pulses and generating second divider output pulses at a variable frequency defined by a variable dividing factor of said second divider;

second pulse counter means for counting the pulses generated by said second frequency divider and generating a second counter output signal corresponding to the instantaneous number of pulses counted;

control means for periodically setting a particular dividing factor value into said second frequency divider to vary the dividing factor of said second frequency divider so that the count of said second pulse counter varies as a function of time during each period of measurement according to the measuring sensor characteristic to be linearized;

comparator means for receiving the instantaneous output signal of the sensor and an analog signal corresponding to said second counter output signal, and generating a strobe signal when the analog signal and the instantaneous sensor output signal are equal; and memory means responsive to said strobe signal to generate an output signal corresponding to the instantaneous count of said first pulse counter when said strobe signal is generated.

2. The circuit of claim 1 wherein said control means includes a programmable read-only memory for storing the particular values of dividing factors that are to be set in said second frequency divider during each period of measurement.

3. The circuit of claim 2 including program counter means for controlling the programmable memory, said program counter being advanced in response to a step signal generated by said first pulse counter after each counting of a specified number of said first divider output pulses.

4. The circuit of claim 1 including digital-analog converter means for receiving the digital second counter output signal and generating said corresponding analog signal.

5. The circuit of claim 1 wherein said memory means includes a store responsive to said strobe signal to receive and retain the instantaneous count of said first pulse counter.

6. The circuit of claim 5 including digital display means for displaying a digital representation of the contents of said store.

7. The circuit of claim 5 including a digital-analog converter connected to the output of said store for receiving a digital representation of the contents of said store and generating a corresponding analog signal, and analog display means for displaying a representation of said corresponding analog signal.

8. The circuit of claim 1 including means for normalizing the output signal of said measuring sensor and applying the normalized signal to the comparator.

* * * * *